United States Patent [19]

Duflot et al.

[11] Patent Number: 5,376,907
[45] Date of Patent: Dec. 27, 1994

[54] HIGH-FREQUENCY TUNABLE FILTER

[75] Inventors: Bernard Duflot; Michel Byzery, both of Cholet, France

[73] Assignee: Thomson-CSF, Puteaux, France

[21] Appl. No.: 32,028

[22] Filed: Mar. 16, 1993

[30] Foreign Application Priority Data

Mar. 17, 1992 [FR] France .................. 92 03161

[51] Int. Cl.⁵ .............................................. H03H 7/01
[52] U.S. Cl. .................................. 333/174; 333/175
[58] Field of Search ............... 333/167, 174, 175, 185; 334/15; 455/191.2, 193.3, 200.1, 307

[56] References Cited

U.S. PATENT DOCUMENTS

| | | | |
|---|---|---|---|
| 3,110,004 | 11/1963 | Pope | 333/175 X |
| 4,450,417 | 5/1984 | Folkmann | 333/174 X |
| 4,839,617 | 6/1989 | Speake | 333/174 |
| 5,023,941 | 6/1991 | Trumpff et al. | 455/307 |
| 5,150,085 | 9/1992 | Hales | 333/174 |

FOREIGN PATENT DOCUMENTS

| | | |
|---|---|---|
| 0125586 | 11/1984 | European Pat. Off. . |
| 2555847 | 5/1985 | France . |
| 0081340 | 5/1983 | Japan . |
| 0086609 | 3/1989 | Japan .................. 334/15 |
| 9013943 | 11/1990 | WIPO .................. 333/175 |

Primary Examiner—Seungsook Ham
Attorney, Agent, or Firm—Oblon, Spivak, McClelland, Maier & Neustadt

[57] ABSTRACT

The high frequency tunable filter includes first and second oscillating circuits tuned by voltage-controlled varicap diodes and coupled together via coupling varicap diodes. The voltage-controlled varicap diodes for the tuning of the oscillating circuits and the coupling varicap diodes are controlled by an identical control voltage to obtain the tuning of the filter to its working frequency and to obtain the critical coupling of the two oscillating circuits. The filter finds particular application in the area of portable radio transceivers.

4 Claims, 1 Drawing Sheet

HIGH-FREQUENCY TUNABLE FILTER

BACKGROUND OF THE INVENTION

The present invention relates to a high-frequency tunable filter. It can be applied notably to the making of miniature filters designed for the high-frequency reception heads of VHF (very high frequency) RF receivers working in frequency hopping mode.

In RF receivers working in frequency hopping mode, there is a known way of placing a filter at the foot of the antenna to carry out the functions of filtering, selectivity and rejection of the image frequencies to enable the receiver to be tuned to the reception frequencies.

In the 30-88 MHZ or 68-150 MHZ frequency ranges, this filter is conventionally made in the form of two parallel oscillating circuits tuned by varicap (or varactor) diodes coupled to one another by mutual induction.

However, for the making of small-sized portable or hand-held RF sets, the amount of space taken up by these filters is very great because of the spacing necessary between the two oscillating circuits to achieve coupling by mutual induction. Furthermore, when these filters have to operate over extensive ranges of frequency, the adjusting of the spacing between the two oscillating circuits so that they remain in their critical coupling mode is difficult to achieve, and for very substantial frequency tuning ranges covering, for example, two to three octaves on frequency steps or stages that do not exceed 10 ms, this coupling mode does not allow the coupling circuits to remain in a critical coupling state throughout the frequency range.

SUMMARY OF THE INVENTION

The aim of the invention is to overcome the above-mentioned drawbacks.

To this effect, an object of the invention is a high frequency tunable filter comprising a first oscillating circuit and a second oscillating circuit tuned by voltage-controlled varicap diodes, comprising varicap diodes coupled between the first oscillating diode and the second oscillating diode, wherein the varicap diodes for the tuning of the oscillating circuits and the coupling varicap diodes between the first oscillating circuit and the second oscillating circuit are controlled by a same control voltage to obtain the tuning of the filter to its working frequency and the critical coupling of the two oscillating circuits, and wherein the resultant coupling capacitance between the two oscillating circuits is about $Q_c$ times lower than the resultant capacitance necessary for the tuning of each oscillating circuit, $Q_c$ being the coefficient of loaded Q of the filter.

The main advantages of using varicap diodes to set up the coupling between the two oscillating circuits is that it reduces the space occupied by the filters made according to this principle and makes it possible, by a single voltage control, to tune oscillating circuits and obtain the critical coupling of these two circuits. This makes it possible to obtain high selectivity of the filter over a wide frequency band.

BRIEF DESCRIPTION OF THE DRAWING

Other features and advantages of the invention shall appear here below from the following description, made with reference to the appended drawing wherein.

DETAILED DESCRIPTION OF THE INVENTION

Figure 1:
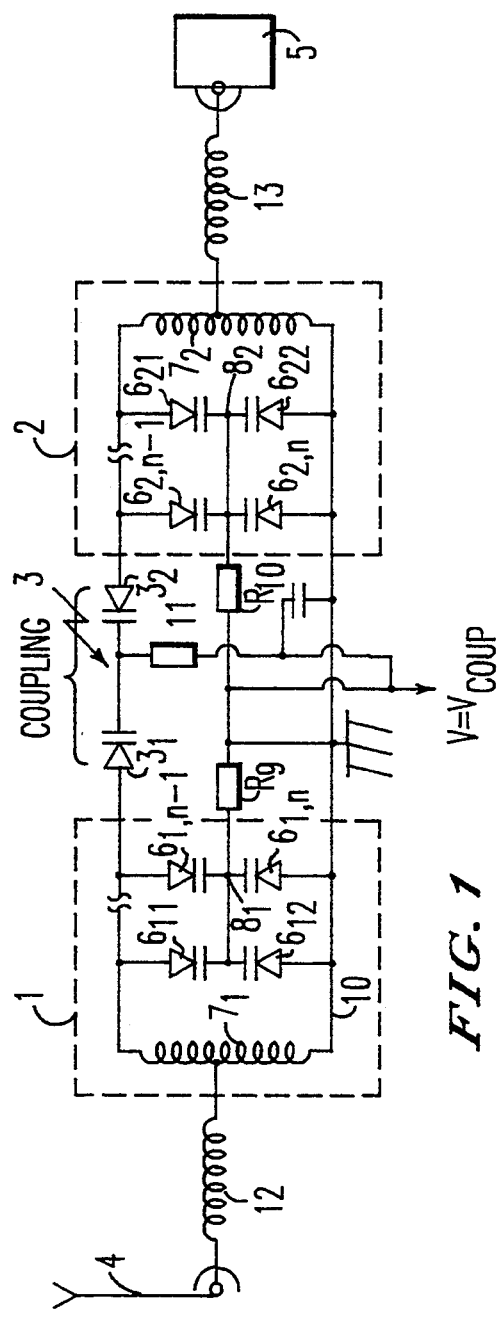
FIG. 1 shows a first embodiment of a filter according to the invention.

The filter that is shown in FIG. 1 comprises a first oscillating circuit 1 and a second oscillating circuit 2, said oscillating circuits being tunable by voltage and coupled to each other by varicap diodes 3 positioned between a reception antenna 4 and a first reception stage of a radio receiver 5o Each oscillating circuit comprises pairs of varicap diodes, directly coupled to one another in a cathode-to-cathode arrangement such that voltage potentials measured at each of the cathodes of a given pair of said varicap diodes are identical, respectively referenced $6_{11} \ldots 6_{2n}$ and parallel-connected to the terminals of an inductor $7_1$, $7_2$ respectively. The points $8_1$ and $8_2$ common to each pair of diodes 6 are made through resistors R9 and R10 (see FIG. 1) and are biased by a tuning voltage V applied by means of said resistors. One of the two ends of each of the inductors 7 is connected to a common ground circuit 10. Their second ends are coupled to each other by means of two varicap diodes $3_1$, $3_2$ which are directly coupled to one another in a cathode-to-cathode arrangement such that voltage potentials measured at each of the cathodes of a given pair of said varicap diodes are identical and series-connected. These diodes achieve a capacitive coupling between the two oscillating circuits 1 and 2. The common point of the two coupling diodes is biased by a voltage $V_{coup}$ through a biasing resistor 11. Each of the inductances $7_1$, $7_2$ of an oscillating circuit has a connector that is coupled respectively to the antenna 4 and to the input stage of the receiver 5 through inductors 12, 13 respectively. This system can be used to obtain a constant loaded Q in the frequency band used.

The mode of coupling by varicap diodes thus achieved makes it possible, by means of a judicious choice of the capacitances of the diodes, to remain for as long as possible in the vicinity of the critical coupling between the two oscillating circuits 1 and 2 in the frequency range used and to provide for a operation of the filter in frequency hopping mode with sufficient agility. The critical coupling of two electrically coupled circuits is the optimum value of coupling; that for which the best transfer of power between the two circuits takes place. If the coupling between the two circuits is made tighter or loose than the critical value, the power transfer between the two circuits becomes less efficient.

This choice results from the following considerations. If we take, for example, a filter with 2n varicap diodes per oscillating circuit, and if $C_{acc}$ designates the capacitance of a diode and $Q_c$ designates the coefficient of loaded Q of the filter, then the value of the coupling capacitance of the varicap diode needed to remain at the critical coupling is defined by the relationship:

$$C_{coup} = (n \cdot C_{acc})/2 \cdot Q_c \qquad (1)$$

Since the law of variation of the capacitance $C_v$ of a varicap diode as a function of the biasing voltage V that is applied to it has the form:

$$C_{(v)} = C_o(1 + V/\emptyset)^{-\delta} \qquad (2)$$

where: C is the capacitance at V=0 volt, $\delta$ is the slope of variation (capacitance—voltage) of the varicap diode;

and $\emptyset$ is the contact potential, by replacing, in the equation (1), $C_{acc}$ by $C_{(V)}$, the law of variation of the coupling capacitance is then:

$$C_{coup} = n.C_0/[2Q_c(1+V/\emptyset)^\delta] \qquad (3)$$

In comparing the relationships (2) and (3) together, it can be seen that the coupling capacitance should have approximately a capacitance that is $Q_c$ times lower than the total capacitance of the tuning varicap diodes implemented in each oscillating circuit of the filter.

Naturally, the value of the coupling capacitance can be obtained according to need by the series connection of a varying number of varicap diodes that depends on the type of varicap diode used. This capacitance value can be obtained notably as shown for example in FIG. 2 wherein it is obtained, unlike in the case of FIG. 1, by means of two pairs of series-connected varicap diodes 14 to 17.

Figure 2:
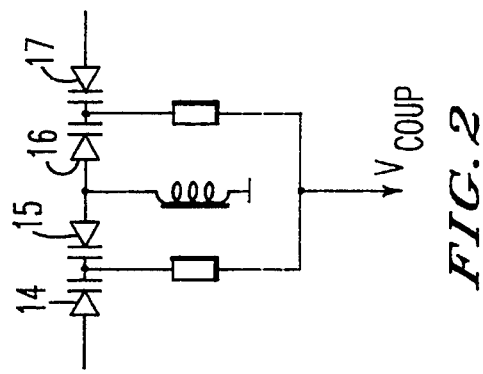
FIG. 2 shows a mode of assembling varicap diodes to set up the coupling between the two oscillating circuits of the filter of FIG. 1.
Figure 3:
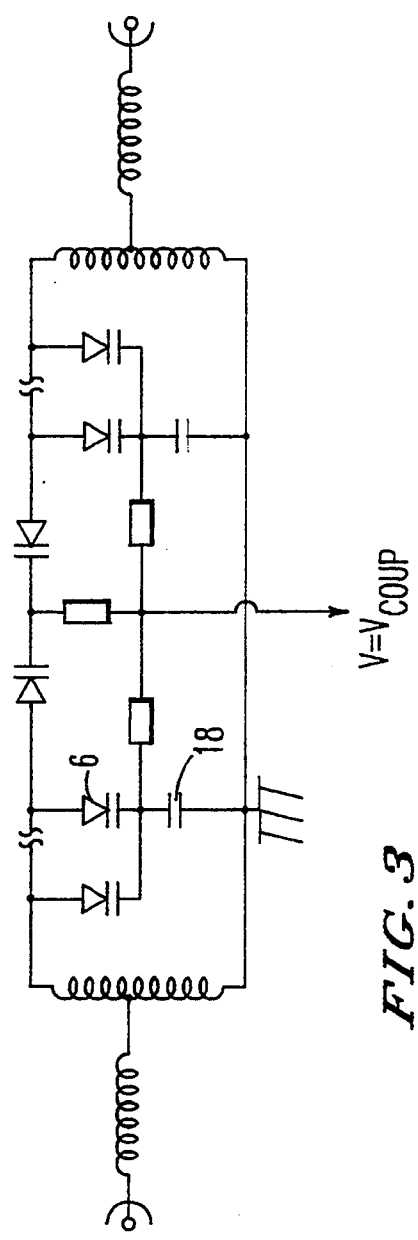
FIG. 3 shows a second embodiment of a filter according to the invention.

Also, as can be seen in FIG. 3, the pairs of varicap diodes, directly coupled to one another in a cathode-to-cathode arrangement such that voltage potentials measured at each of the cathodes of a given pair of said varicap diodes are identical and parallel-connected to the terminals of the inductors $7_1$, $7_2$ of FIG. 2, can equally well be replaced by pairs formed by the series connection of at least one capacitor 18 with a varicap diode 6. In this case, the relationships (1) and (3) give the value $C_{coup}$ to be multiplied by two.

What is claimed is:

1. A high frequency tunable filter comprising:
a first oscillating circuit and a second oscillating circuit, said first oscillating circuit and said second oscillating circuit comprising voltage-controlled varicap diodes and being tunable thereby; wherein said first oscillating circuit and said second oscillating circuit are coupled together via pairs of coupling varicap diodes connected in series each pair of said coupling varicap diodes directly coupled to one another in a cathode-to-cathode arrangement such that voltage potentials measured at each of the cathodes of said pairs of coupling varicap diodes are identical, wherein said voltage-controlled varicap diodes by which said first oscillating circuit and said second oscillating circuit are tunable and said coupling varicap diodes are controlled by an identical control voltage to achieve the tuning of said filter to its working frequency and to achieve the critical coupling between said first oscillating circuit and said second oscillating circuit, and wherein a resultant coupling capacitance formed between said first oscillating circuit and said second oscillating circuit is approximately $Q_c$ times lower than a necessary resultant capacitance for the tuning of each of said first oscillating circuit and said second oscillating circuit, $Q_c$ being the coefficient of loaded Q of said filter.

2. A high frequency tunable filter according to claim 1, wherein each of said first oscillating circuit and said second oscillating circuit comprises an inductor and at least one pair of voltage-controlled varicap diodes directly coupled to one another in a cathode-to-cathode arrangement such that voltage potentials measured at each of the cathodes of a given pair of said voltage-controlled varicap diodes are identical and such that each pair of voltage-controlled varicap diodes is electrically connected in parallel to said inductor.

3. A high frequency tunable filter according to claim 1, wherein each of said first oscillating circuit and said second oscillating circuit comprises an inductor which is electrically connected in parallel to at least one pair of voltage-controlled varicap diodes that are directly coupled to one another in a cathode-to-cathode arrangement such that voltage potentials measured at each of the cathodes of a given pair of said voltage-controlled varicap diodes are identical and that are electrically connected in series with at least one capacitor.

4. A high frequency tunable filter according to claim 1, wherein said first oscillating circuit and said second oscillating circuit are respectively coupled to an RF reception antenna and to an input of an RF receiver unit.

* * * * *